United States Patent
Wuu et al.

(10) Patent No.: US 9,953,687 B1
(45) Date of Patent: Apr. 24, 2018

(54) PSEUDO-DYNAMIC CIRCUIT FOR MULTI-VOLTAGE TIMING INTERLOCKS

(71) Applicant: Advanced Micro Devices, Inc., Sunnyvale, CA (US)

(72) Inventors: John J. Wuu, Ft. Collins, CO (US); Ryan Freese, Ft. Collins, CO (US); Russell J. Schreiber, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/299,709

(22) Filed: Oct. 21, 2016

(51) Int. Cl.
| | |
|---|---|
| *G11C 11/41* | (2006.01) |
| *G11C 11/419* | (2006.01) |
| *G11C 7/12* | (2006.01) |
| *H03K 19/0185* | (2006.01) |
| *G11C 7/06* | (2006.01) |
| *G11C 7/22* | (2006.01) |

(52) U.S. Cl.
CPC ............. *G11C 7/12* (2013.01); *G11C 7/06* (2013.01); *G11C 7/22* (2013.01); *H03K 19/018507* (2013.01)

(58) Field of Classification Search
CPC ........... G11C 7/12; G11C 8/08; G11C 11/419; G11C 7/00; G11C 11/5642; G11C 7/222; G11C 5/143; G11C 5/145; G11C 7/1051; G11C 11/413; G11C 16/06; G11C 16/32
See application file for complete search history.

(56) References Cited

U.S. PATENT DOCUMENTS

| | | | |
|---|---|---|---|
| 4,963,772 A | 10/1990 | Blomgren et al. | |
| 5,036,221 A | 7/1991 | Brucculeri | |
| 5,841,300 A | 11/1998 | Murabayashi | |
| 6,066,965 A | 5/2000 | Blomgren et al. | |
| 6,133,762 A | 10/2000 | Hill | |
| 6,624,665 B2 | 9/2003 | Kim | |
| 7,698,673 B2 | 4/2010 | Afleck | |
| 7,724,036 B2 | 5/2010 | Das | |
| 7,777,522 B2 | 8/2010 | Yang | |
| 7,902,878 B2 | 3/2011 | Saint-Laurent | |
| 7,977,976 B1 | 7/2011 | Tang | |
| 7,977,977 B1 | 7/2011 | Natarajan et al. | |
| 8,593,171 B2 | 11/2013 | Kosonocky et al. | |
| 8,901,965 B2 | 12/2014 | Fish | |
| 8,912,853 B2* | 12/2014 | Burnette | H03K 3/356121 331/185 |
| 8,928,354 B2 | 1/2015 | Kim | |
| 9,123,439 B2* | 9/2015 | Pilo | G11C 11/419 |

(Continued)

OTHER PUBLICATIONS

U.S. Appl. No. 15/239,217, filed Aug. 17, 2016, entitled "Low Power Adaptive Synchronizer", naming Greg Sadowski et al. as inventors.

(Continued)

*Primary Examiner* — Hien Nguyen
(74) *Attorney, Agent, or Firm* — Zagorin Cave LLP (57) ABSTRACT

An interlock circuit utilizes a single combinatorial pseudo-dynamic logic gate to take inputs from two voltage domains at the same time without requiring either input to be level shifted. The interlock design allows hold timing to be met across a large voltage range of both supplies in a dual-voltage supply environment while not significantly hurting setup time by having much lower latency than the latency of a level shifter.

20 Claims, 7 Drawing Sheets

(56) References Cited

U.S. PATENT DOCUMENTS

| | | | |
|---|---|---|---|
| 9,124,259 B2* | 9/2015 | Kimoto | H03K 3/356069 |
| 9,396,790 B1* | 7/2016 | Chhabra | G11C 11/419 |
| 9,413,354 B2* | 8/2016 | Stirk | G01R 31/3675 |
| 9,473,141 B2* | 10/2016 | Kerr | H03K 19/01750 |
| 9,552,892 B1 | 1/2017 | Kosonocky et al. | |
| 9,564,901 B1* | 2/2017 | Chow | H03K 19/01855 |
| 2004/0163022 A1 | 8/2004 | Whetsel | |
| 2009/0024888 A1 | 1/2009 | Kurimoto | |
| 2010/0091688 A1* | 4/2010 | Staszewski | H03D 7/1441 370/277 |
| 2012/0044009 A1* | 2/2012 | Hess | H03K 3/356182 327/333 |
| 2012/0319781 A1* | 12/2012 | Scott | G11C 7/1084 330/310 |
| 2013/0154712 A1* | 6/2013 | Hess | H03K 19/01852 327/333 |
| 2014/0091998 A1* | 4/2014 | Ko | G09G 3/3674 345/100 |
| 2016/0359487 A1* | 12/2016 | Nadkarni | H03K 19/01852 |

OTHER PUBLICATIONS

Abraham, J., 12. Dynamic CMOS Logic, Department of Electrical and Computer Enginnering, The University of Texas at Austin, VLSI Design, Oct. 10, 2016, 12 pages.

Rabaey, J., "Dynamic CMOS Design," Digital Integrated Circuits, Prentice-Hall, 1996, pp. 223-234.

U.S. Appl. No. 15/424,367, filed Feb. 3, 2017, entitled Contention-Free Dynamic Logic, naming Alexander W. Schaefer and David H. McIntyre as inventors.

U.S. Appl. No. 15/492,249, filed Apr. 20, 2017, entitled Contention-Free Dynamic Logic, naming Alexander W. Schaefer as inventor.

* cited by examiner

When VDD1>>VDD2 BLPCX
turns on before SAEN
creating a failure

Fig. 2B

When VDD2>>VDD1, pulse width of BLPCX shrinks
until it is not wide enough to precharge the bitlines
without slowing down the clocks

Even when VDD2>>VDD1, pulse width of BLPCX due to faster interlock circuit fuilt as one pseudo-dynamic NAND gate rather than level shifter and NAND gate

Fig. 7

PSEUDO-DYNAMIC CIRCUIT FOR MULTI-VOLTAGE TIMING INTERLOCKS

BACKGROUND

Field of the Invention

This invention relates to interlock circuits that accept inputs signals from different voltage domains.

Description of the Related Art

Large offsets in voltage between voltage supplies in multi-voltage circuits can cause serious hold time problems. Hold time refers to the time that an input signal has to be stable in order to be properly evaluated with reference to another signal, such as a clock edge. The typical approach to fixing such hold problems has been to use slow interlock circuits or synchronizers. One slow interlock circuit uses a level shifter to shift the voltage of one signal so both signals are in the same voltage domain. However, the use of the level shifter slows the maximum frequency of the circuit. Synchronizers take multiple cycles, are typically very large, and can significantly limit bandwidth and latency of the circuit in question.

Figure 1:
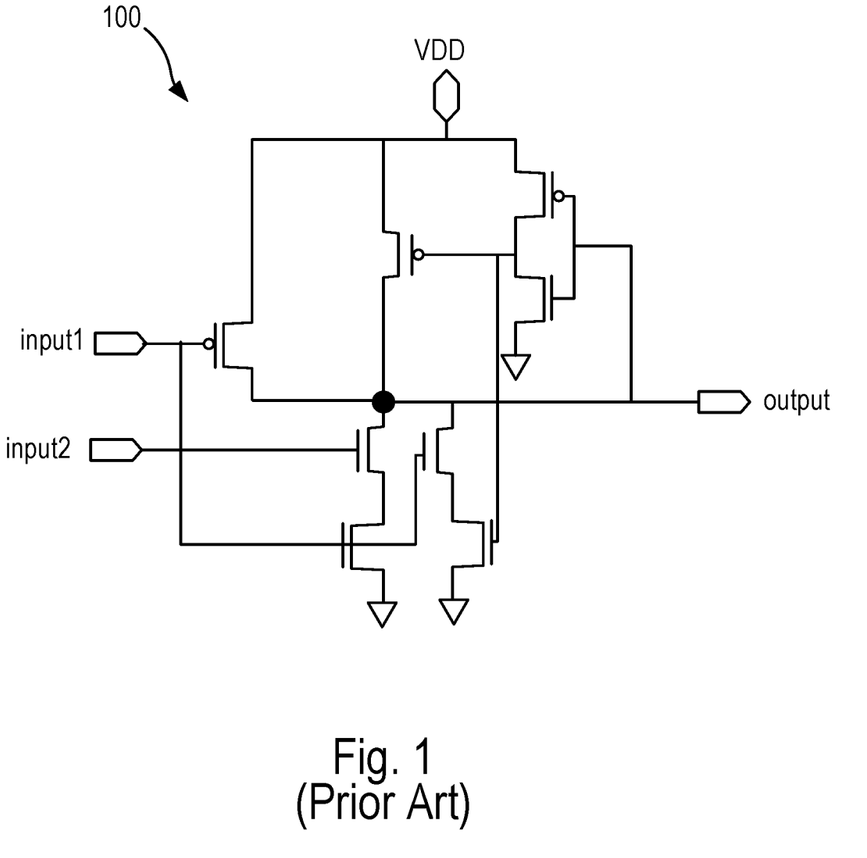
FIG. 1 illustrates a conventional dynamic logic circuit.

FIG. 1 shows a conventional dynamic logic circuit that may be used, e.g., as a high speed NAND gate rather than a standard CMOS NAND gate.

Improvements in the way signals from different voltage domains may be combined is desirable, particularly for high speed designs.

SUMMARY OF EMBODIMENTS OF THE INVENTION

In one embodiment, an apparatus includes an interlock circuit coupled to receive a first input signal from a first voltage domain and a second input signal from a second voltage domain. The interlock circuit includes a keeper circuit having a pull-up portion coupled to the second input signal and configured to maintain an output signal at an output node of the interlock circuit at a first high voltage level associated with the first voltage domain until the first input signal is at the first high voltage level and the second input signal is at a second high voltage level associated with the second voltage domain. A pull-down circuit receives the first input signal and the second input signal. The keeper circuit is configured to be weaker than the pull-down circuit when the first high voltage level is higher than the second high voltage level, to thereby cause the output node to transition from the first high voltage level to a low voltage level responsive to the second input signal transitioning to the second high voltage level while the first input signal is at the first high voltage level.

In another embodiment, a method includes receiving at an interlock circuit a first input signal from a first voltage domain and a second input signal from a second voltage domain. An output node of the interlock circuit is kept at a first voltage domain high voltage level using a keeper circuit coupled to a first power supply node associated with the first voltage domain while the first input signal is at the first voltage domain high voltage level and the second input signal is at a low voltage level. Responsive to the second input signal transitioning from the low voltage level to a second voltage domain high voltage level while the first input signal is at the first voltage domain high voltage level, causing the output node to transition from the first voltage domain high voltage level to the low voltage level using the keeper circuit that is weaker than a pull-down circuit coupled between the output node and a ground node.

In another embodiment, an interlock circuit includes a pull-up circuit coupled to receive a first input signal to the interlock circuit from a first voltage domain and to charge an output node of the interlock circuit to a first voltage domain high voltage level responsive to the first input signal being at a low voltage level. A first circuit includes a first and second transistor serially coupled between a first power supply node of the first voltage domain and an output node of the interlock circuit. The first transistor is coupled to receive a second input signal to the interlock circuit from a second voltage domain as a first gate signal and the second transistor is coupled to receive a second gate signal determined according to the output node. A pulldown circuit includes a third and a fourth transistor serially coupled between a ground node and the output node of the interlock circuit, the third and fourth transistors coupled to receive the first and second input signals as respective gate signals. The interlock circuit maintains the output node at the first voltage domain high voltage level until the first input signal being at the first voltage domain high voltage level and the second input signal being at the second voltage domain high voltage level causes the interlock circuit to supply the low voltage level on the output node.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments described herein provide for a single combinatorial gate to take inputs from two voltage domains at the same time without requiring either input to be level shifted. The interlock design allows hold timing to be met across a large voltage range of both supplies in a dual-voltage supply environment while not significantly hurting setup time by having much lower latency than the latency of a level shifter. Setup time refers to the time one signal has to be stable with reference to another signal, such as a clock edge, to ensure proper evaluation of the one signal.

Figure 2A:
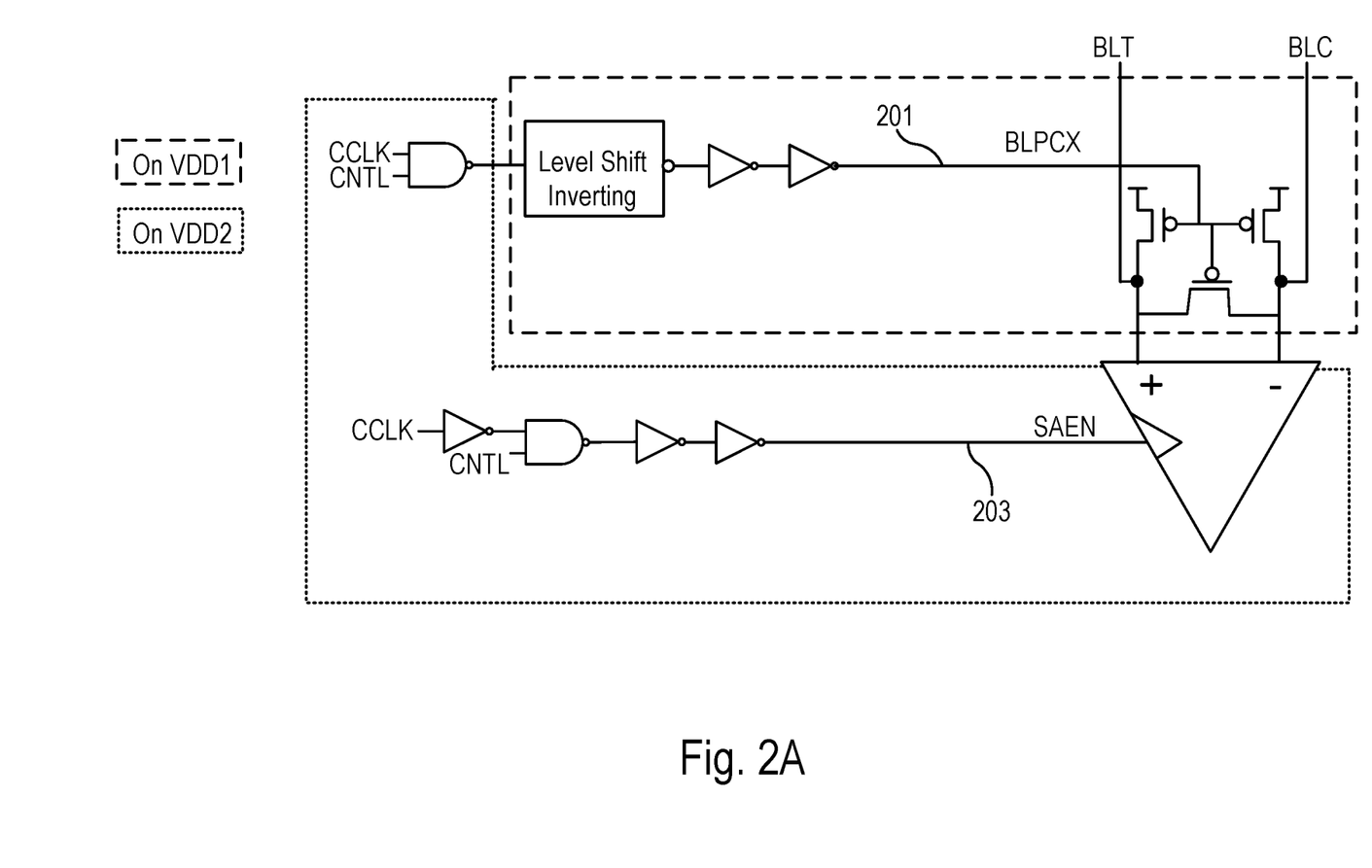
FIG. 2A illustrates how utilization of signals from different voltage domains can result in a timing skew.
Figure 2B:
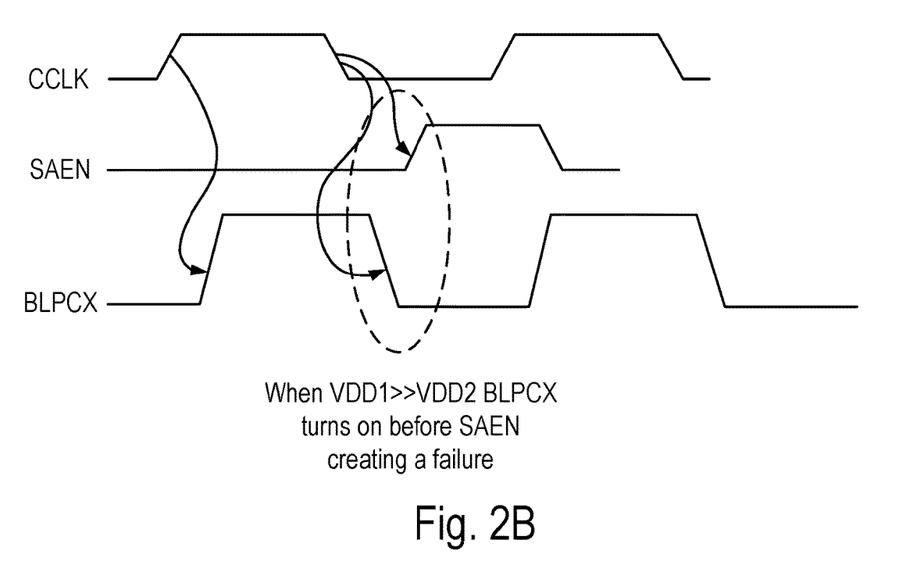
FIG. 2B illustrates a failure that can occur due to a timing skew in the example of FIG. 2A.

Designing a circuit with multiple voltage domains presents a number of challenges. Even in the case of a single voltage domain, achieving required hold time in a large macro circuit can be difficult and timing interlocks are often employed to minimize timing skew between launch and capture paths. Trying to minimize timing skew across voltage domains is even more challenging. FIG. 2A illustrates an example where signals from different voltage domains VDD1 and VDD2 are utilized to generate a bitline precharge signal 201 and a sense amplifier enable signal 203 and timing skew causes a failure. As shown in FIG. 2B, because the signals are not interlocked, when VDD1>>VDD2, the bit line precharge signal (BLPCX) for bit line true (BLT) and bit line complement (BLC) turns on before the sense amplifier enable signal SAEN resulting in failure.

Figure 3:
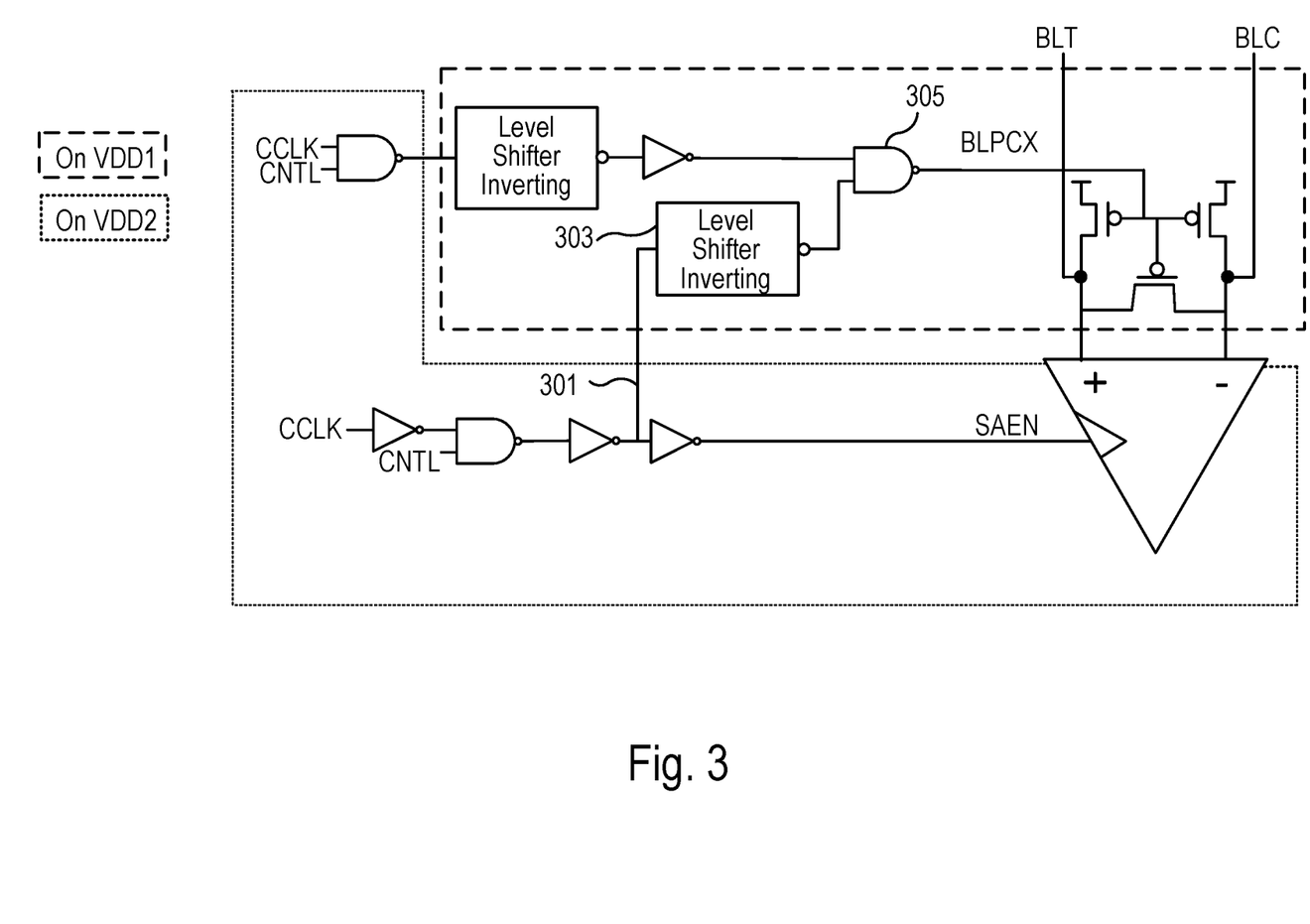
FIG. 3 illustrates use of a level shifter and a NAND gate as an interlock circuit to overcome the timing skew problem associated with the example of FIG. 1.
Figure 4:
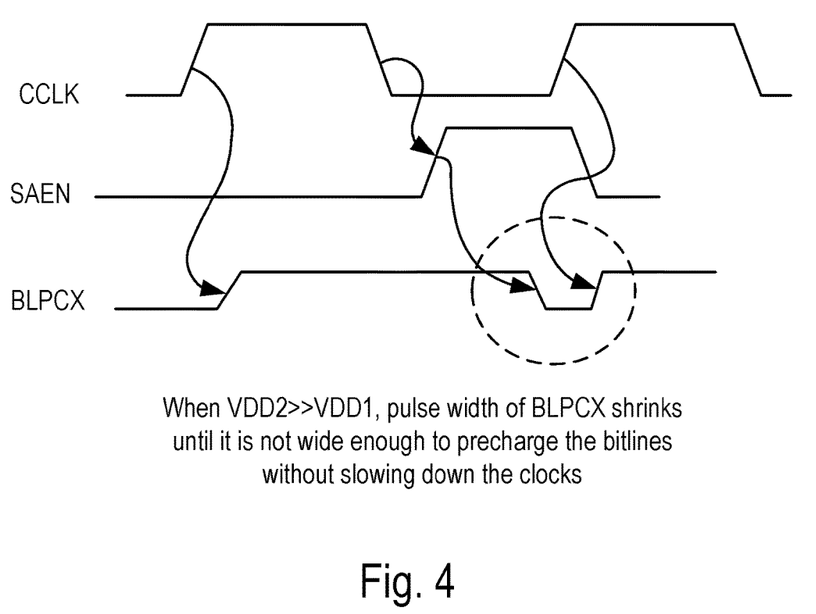
FIG. 4 illustrates timing issues that may be associated with the level shifter approach of FIG. 3.

One way to interlock signals from two different voltage domains is to shift one of the two signals to the other's voltage domain and then interlock them together. FIG. 3 illustrates such an approach where signal 301 (on VDD2) is shifted in a voltage shifter 303 (and inverted in the illustrated embodiment) to the voltage domain of VDD1 and then interlocked using NAND gate 305. That ensures that BLPCX does not precharge until sense enable (SAEN) is ready. However, at some voltage timing corners, the added delay of the level shifter 303 breaks setup timing. FIG. 4 illustrates timing issues that may be associated with the interlock approach of FIG. 3. When VDD2>>VDD1 in FIG. 3, as shown in FIG. 4, the pulse width of BLPCX shrinks until it is not wide enough to precharge the bitlines without slowing down the clocks. Thus, the solution shown in FIG. 3 can adversely affect frequency.

To enable tight interlocks across voltage domains without this setup timing problem, an embodiment uses a pseudo-dynamic NAND structure that can take two different signals from two different voltage domains without the need for a level shifter. By doing this, it allows simultaneously meeting setup and hold time across a wide voltage range without sacrificing setup timing. The circuit is pseudo-dynamic because the keeper circuit is partially gated by one of the input signals. A conventional dynamic circuit, such as shown in FIG. 1, has the keeper at the same strength regardless of the inputs.

Figure 5:
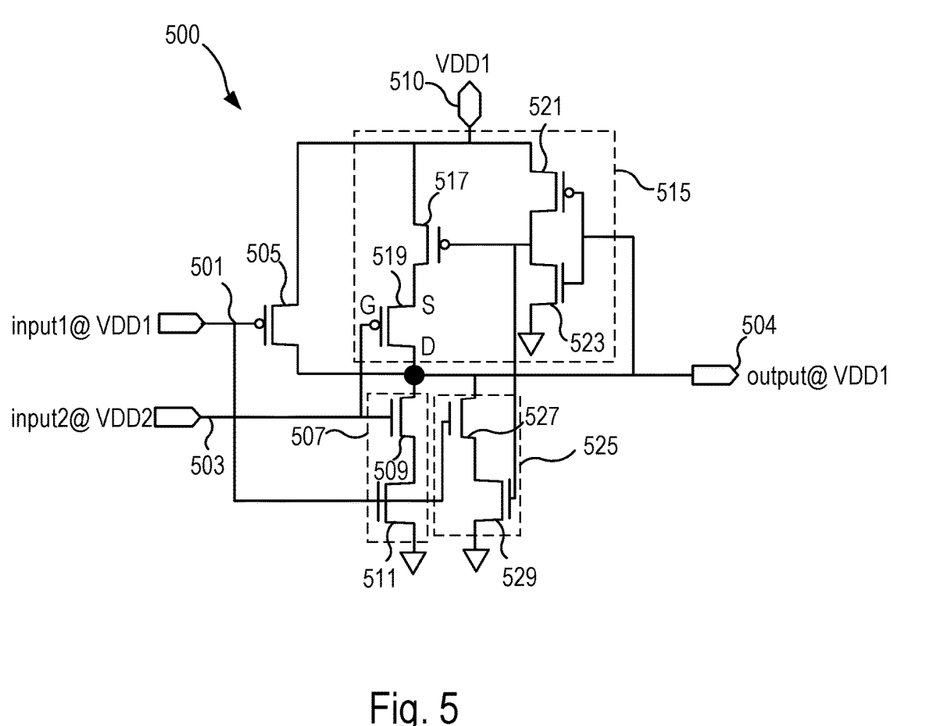
FIG. 5 illustrates an interlock circuit according to an embodiment that logically combines two signals from different voltage domains without the need for a level shifter.

FIG. 5 illustrates an embodiment of such an interlock circuit. FIG. 5 uses dynamic logic to precharge the output. However, in contrast to prior art dynamic logic such as shown in FIG. 1, the dynamic circuit of FIG. 5 can operate as an interlock circuit and receive input signals from different voltage domains. The interlock circuit receives input1 501 from the VDD1 voltage domain. The VDD1 voltage domain is the voltage domain in which the interlock circuit 500 operates. The interlock circuit 500 also receives input2 503 from the VDD2 voltage domain. The interlock circuit 500 ensures that the output 504 (at a VDD1 voltage level) remains at a high voltage until both input1 501 and input2 503 are at high voltage levels. When both input1 501 and input2 503 go to a high voltage level corresponding to their respective voltage domains, the output node 504 goes low similar to the operation of a NAND gate. However, the output 504 may go from low to high when input1 goes low but not when input2 goes low, thus distinguishing from operation of a conventional NAND gate. Note that the voltage levels corresponding to a high logic level will typically be different for voltage domains VDD1 and VDD2. Thus, if VDD1 is higher, the voltage level corresponding to a high voltage will be higher than the voltage level corresponding to a high voltage for a VDD2 signal. In some embodiments the difference between VDD1 and VDD2 may be as much as 400 mV. Other embodiments may allow a greater or smaller difference. In addition, while VDD1 can be greater than VDD2, VDD1 can also be less than VDD2 and the embodiment illustrated in FIG. 5, works in either case. For example, VDD1 may be a supply voltage associated with a processor or other circuit that utilizes power savings techniques and the voltage may vary based on the loading (and frequency) of the processor. VDD2 may be from a static voltage domain. Thus, VDD1 may be higher at some points during operation and lower at other points than VDD2.

If input1 501 is at a low voltage level, the pull-up transistor 505 pulls the output 504 towards the power supply node 510 of voltage domain VDD1. The interlock circuit 500 includes a pull-down circuit 507 that includes NMOS transistors 509 and 511 that are respectively coupled to input2 503 and input1 501. The pull-down circuit operates to couple the output node 504 to a ground node through transistors 509 and 511 when both input1 and input2 are at high voltage levels corresponding to logic highs for the two voltage domains. The embodiment of FIG. 5 also includes a pull-up keeper circuit 515 that operates to keep the output node 504 at a high level by coupling output node 504 to VDD1 through transistors 517 and 519. Note that the output node controls transistor 517 through the inverter formed by transistors 521 and 523. However, the gate of transistor 519 is coupled to input2, which has a high logic level based on the VDD2 voltage domain. Note that the low voltage levels of the first and second voltage domains VDD1 and VDD2 are the same as VDD1 and VDD2 share a common ground plane.

One objective of the embodiment shown in FIG. 5 is to ensure that the output node 504 does not go low until both input1 and input2 are at high voltage levels for their respective voltage domains. That interlock ensures that downstream timing requirements are met. Assume output node 504 is high, input1 is high, and input2 transitions from a low voltage level to a high voltage level. If transistor 519 were absent, as shown in FIG. 1, there would be a battle between the pull-up portion of the keeper circuit pulling the output node 504 up to VDD through transistor 517 and the pull-down circuit 507 pulling the output node down towards ground (a low logic level). Still assuming transistor 519 was absent, if input2 transitions to a high voltage level and that voltage level is lower than the high voltage level of VDD1, the transistor 509 may not turn on as strongly as transistor 517, thereby causing the pull-up portion of the keeper circuit to be "more on" than the pull-down circuit 507 resulting in a possible error in that the output fails to switch to low.

The addition of transistor 519 in the pull-up portion of the keeper circuit solves the contention issue. Assume again that input1 is high and input2 transitions from a low voltage level corresponding to a logical low to a high voltage level. Further assume the VDD2 high voltage level is below the VDD1 high voltage level. Transistor 519 turns off if its gate to source voltage $V_{GS}$ is less than the threshold voltage $V_{THPFET}$ of the PMOS transistor 519, e.g., −0.3V. However, with input2 transitioning to a high logic level, the source node (S) may be at VDD1 (say 1.2 V) while the gate node may transition to 0.8 V. That means that transistor 519 VGS is −0.4 V, which means that transistor 519 is technically on but not very strongly, as compared to the transistors 509 and 511 in the pull-down circuit 507. Thus, the addition of transistor 519, even if it is not shut off, still weakens the keeper PMOS pull-up stack as compared to the NMOS stack of pull-down circuit 507. That helps ensure that the output node transitions to a low voltage level when input2 goes to a high logic level, even though the high voltage level of input2 (VDD2) is lower than the high voltage level of the voltage domain (VDD1) in which the interlock circuit is operating.

When VDD2 is higher than VDD1, the transition of input2 from low to high works successfully as the pull-down circuit 507 goes strongly on and the keeper pull-up circuit 515 goes strongly off as transistor 519 goes strongly off on a low to high transition with the gate voltage higher than the source voltage.

The embodiment of FIG. 5 also includes a pull-down keeper circuit 525 that includes transistors 527 and 529. The pull-down stack operates to keep the output node 504 at a low logic level if the NMOS stack is turned on (output node 504 low and input1 is high). In other embodiments, the pull-down keeper circuit 525 may be omitted.

Figure 6:
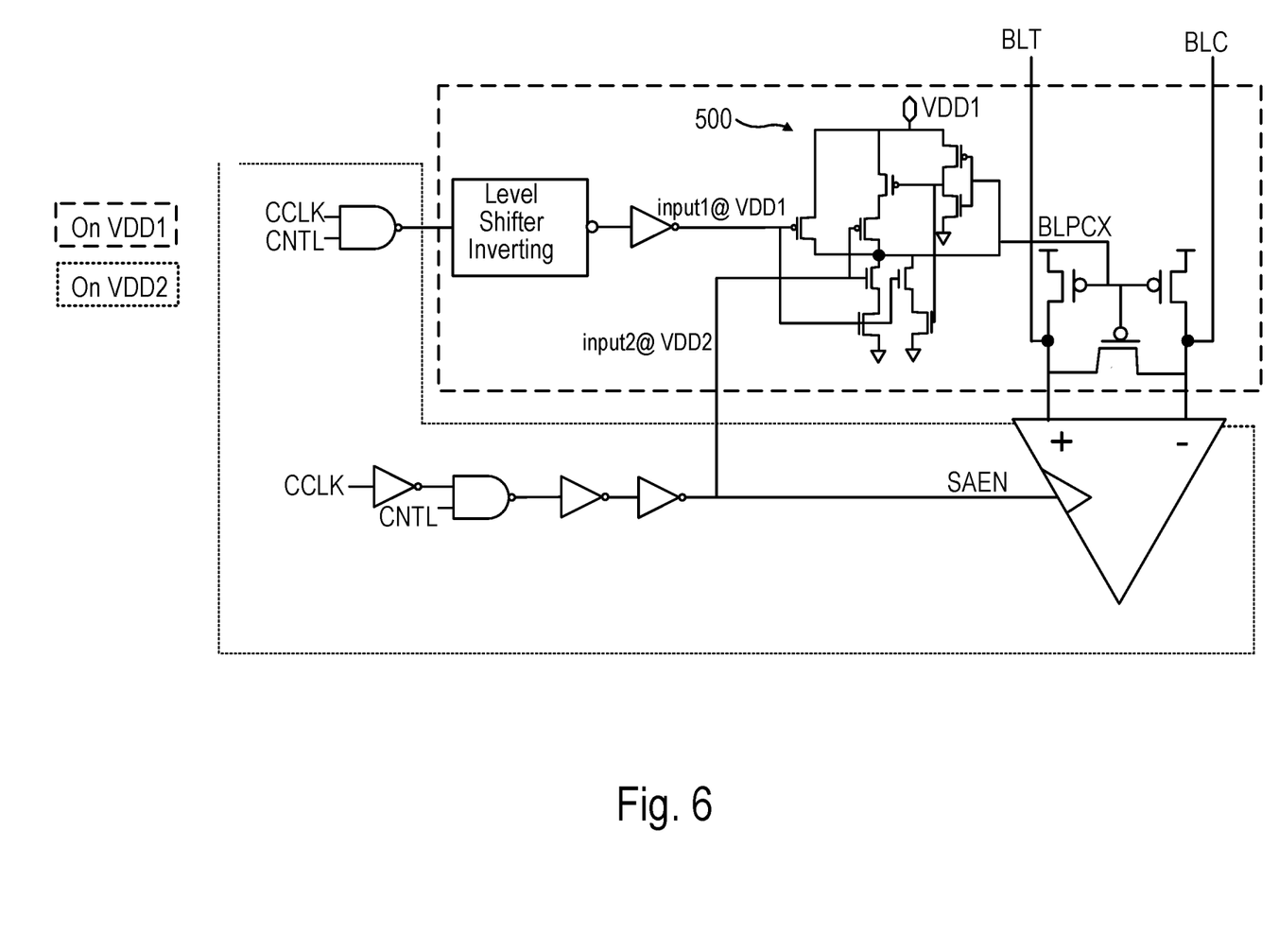
FIG. 6 illustrates an embodiment that utilizes the interlock circuit of the embodiment of FIG. 5.
Figure 7:
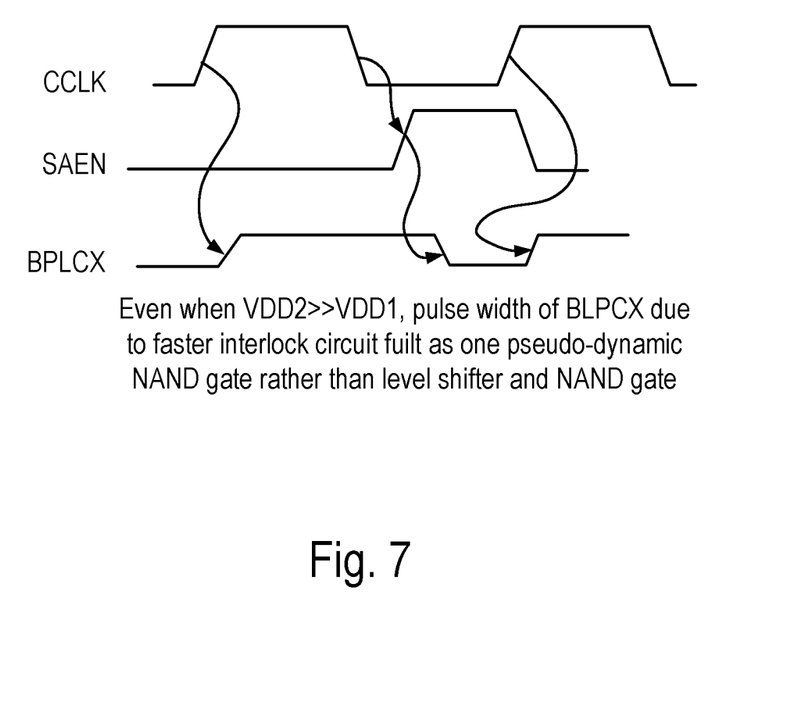
FIG. 7 illustrates a timing diagram associated with the embodiment of FIG. 6.

FIG. 6 shows an embodiment where the interlock circuit 500 may be utilized to ensure that the bit line precharge signal and the sense amplifier enable signal are interlocked to prevent the situations illustrated in FIGS. 2 and 4. Note that the input signals CCLK shown in FIG. 6 may be the same CCLK signal and the control signals CNTL shown in FIG. 6 may be the same CNTL signal. As shown in FIG. 6, the precharge signal before being interlocked is supplied as input 1 to the interlock circuit 500. The sense amplifier enable signal is supplied as input 2. As shown in FIG. 7, even when VDD2>>VDD1, the pulse width of BLPCX is healthy due to a faster interlock circuit operating as a pseudo-dynamic NAND-like gate rather than the level shifter followed by the NAND gate shown in FIG. 3. Further, the bit line precharge signal and the sense amplifier enable signal are interlocked so that the failure illustrated in FIG. 2 does not occur.

While FIG. 6 is one embodiment where the interlock circuit 500 can be advantageously used, in other embodiments, the interlock circuit 500 may be used in other environments, such as to prevent a wordline (WL) from falling before SAEN arrives.

Thus, embodiments for interlocking signals from different voltage domains have been described. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprising:
   an interlock circuit coupled to receive a first input signal from a first voltage domain and a second input signal from a second voltage domain, the interlock circuit including,
      a keeper circuit having a pull-up portion coupled to the second input signal and configured to maintain an output signal on an output node of the interlock circuit at a first high voltage level associated with the first voltage domain until the first input signal is at the first high voltage level and the second input signal is at a second high voltage level associated with the second voltage domain; and
      a pull-down circuit coupled to receive the first input signal and the second input signal, wherein the keeper circuit is configured to be weaker than the pull-down circuit, to thereby cause the output node to transition from the first high voltage level to a low voltage level responsive to the second input signal transitioning to the second high voltage level from the low voltage level while the first input signal is at the first high voltage level.

2. The apparatus as recited in claim 1, wherein the pull-up portion of the keeper circuit comprises:
   first and second transistors serially coupled between the output node of the interlock circuit and a power supply node of the first voltage domain.

3. The apparatus as recited in claim 2,
   wherein the first transistor is coupled to receive an inverted version of the output signal as a first transistor gate signal; and
   wherein the second transistor is coupled to receive the second input signal as a second transistor gate signal.

4. The apparatus as recited in claim 1,
   wherein the second input signal decouples the pull-up portion of the keeper circuit in response to the second input signal transitioning to the first high voltage level from the low voltage level.

5. The apparatus as recited in claim 1, wherein the first high voltage level associated with the first voltage domain is a different voltage level than the second high voltage level associated with the second voltage domain.

6. The apparatus as recited in claim 2, wherein the pull-down circuit comprises:
   a third and a fourth transistor serially coupled between the output node and a ground node;
   the third transistor coupled to receive the first input signal as a third transistor gate signal; and
   the fourth transistor coupled to receive the second input signal as a fourth transistor gate signal.

7. The apparatus as recited in claim 1, wherein,
   the keeper circuit is configured to be weaker than the pull-down circuit, to thereby cause the output node to transition from the first high voltage level to the low voltage level responsive to the first input signal transitioning to the first high voltage level from the low voltage level while the second input signal is at the second high voltage level.

8. The apparatus as recited in claim 1, wherein the keeper circuit further comprises a pull-down portion coupled to the first input signal and the pull-down portion is coupled to an inverted version of the output signal.

9. The apparatus as recited in claim 6, wherein the interlock circuit further comprises a fifth transistor coupled between the output node and the power supply node as a pull-up transistor, the fifth transistor coupled to receive the first input signal as a fifth transistor gate signal, wherein the fifth transistor causes the output node to go to the first high voltage level responsive to the first input signal being at the low voltage level.

10. The apparatus as recited in claim 7, further comprising:
    bitlines associated with a memory;
    a sense amplifier coupled to the bitlines;
    wherein the output node of the interlock circuit is coupled to supply a precharge signal for the bitlines; and
    wherein the second input signal is coupled to an enable input on the sense amplifier.

11. The apparatus as recited in claim 10, further comprising:
    a level shifter circuit configured to receive a signal from the second voltage domain and shift a voltage level of the signal to the first voltage domain, an output of the level shifter circuit coupled to supply the first input signal to the interlock circuit.

12. A method comprising:
receiving at an interlock circuit a first input signal from a first voltage domain and a second input signal from a second voltage domain;
keeping an output node of the interlock circuit at a first voltage domain high voltage level using a keeper circuit coupled to a first power supply node associated with the first voltage domain while the first input signal is at the first voltage domain high voltage level and the second input signal is at a low voltage level; and
responsive to the second input signal transitioning from the low voltage level to a second voltage domain high voltage level while the first input signal is at the first voltage domain high voltage level, causing the output node to transition from the first voltage domain high voltage level to the low voltage level using the keeper circuit that is weaker than a pull-down circuit coupled between the output node and a ground node.

13. The method as recited in claim 12, further comprising, supplying the second input signal to a first transistor in the keeper circuit as a first transistor gate signal thereby resulting in the keeper circuit being less strongly turned on than the pull-down circuit when the second input signal is at the second voltage domain high voltage level and the first input signal is at the first voltage domain high voltage level and the first voltage domain high voltage level is higher than the second voltage domain high voltage level.

14. The method as recited in claim 13, further comprising:
supplying the second input signal to a third transistor in the pull-down circuit as a third transistor gate signal;
supplying the first input signal to a fourth transistor in the pull-down circuit as a fourth transistor gate signal; and
coupling the output node to the ground node through the third and fourth transistors when the first input signal is at the first voltage domain high voltage level and the second input signal is at the second voltage domain high voltage level.

15. The method as recited in claim 13, further comprising using a pull-down portion of the keeper circuit to maintain the output node at the low voltage level.

16. The method as recited in claim 13, further comprising:
supplying to the first input signal to a pull-up transistor coupled between the output node and the first power supply node of the first voltage domain; and
precharging the output node to the first voltage domain high voltage level responsive to the first input signal being at the low voltage level.

17. The method as recited in claim 13, further comprising the interlock circuit supplying the low voltage level responsive to the first input signal being at the first voltage domain high voltage level and the second input signal being at the second voltage domain high voltage level.

18. The method as recited in claim 13, further comprising:
precharging bitlines of a memory based on an output of the interlock circuit; and
enabling a sense amplifier coupled to the bitlines based on the second input signal.

19. An interlock circuit comprising:
a pull-up circuit coupled to receive a first input signal to the interlock circuit from a first voltage domain and to charge an output node of the interlock circuit to a first voltage domain high voltage level responsive to the first input signal being at a low voltage level;
a first circuit including a first and second transistor serially coupled between a power supply node of the first voltage domain and an output node of the interlock circuit, the first transistor coupled to receive a second input signal to the interlock circuit from a second voltage domain as a first gate signal and the second transistor is coupled to receive a second gate signal determined according to the output node;
a pulldown circuit including a third and fourth transistor serially coupled between a ground node and the output node of the interlock circuit, the third and fourth transistors coupled to receive the first and second input signals as respective gate signals; and
wherein the interlock circuit maintains the output node at the first voltage domain high voltage level until the first input signal being at the first voltage domain high voltage level and the second input signal being at a second voltage domain high voltage level causes the interlock circuit to supply the low voltage level on the output node.

20. The interlock circuit as recited in claim 19 wherein the interlock circuit is operable when a first voltage domain high voltage level is greater than a second voltage domain high voltage level and when the first voltage domain high voltage level is less than the second voltage domain high voltage level.

* * * * *